Jan. 1, 1963 N. E. HAMILTON 3,070,859

APPARATUS FOR FABRICATING SEMICONDUCTOR DEVICES

Filed Oct. 6, 1959

INVENTOR.
NOBLE E. HAMILTON

BY

Francis [signature]

ATTORNEY

United States Patent Office 3,070,859

Patented Jan. 1, 1963

3,070,859
APPARATUS FOR FABRICATING SEMICONDUCTOR DEVICES

Noble E. Hamilton, Belmont, Mass., assignor to Clevite Corporation, Cleveland, Ohio, a corporation of Ohio Filed Oct. 6, 1959, Ser. No. 844,766
12 Claims. (Cl. 22—116)

Figures 1, 2:
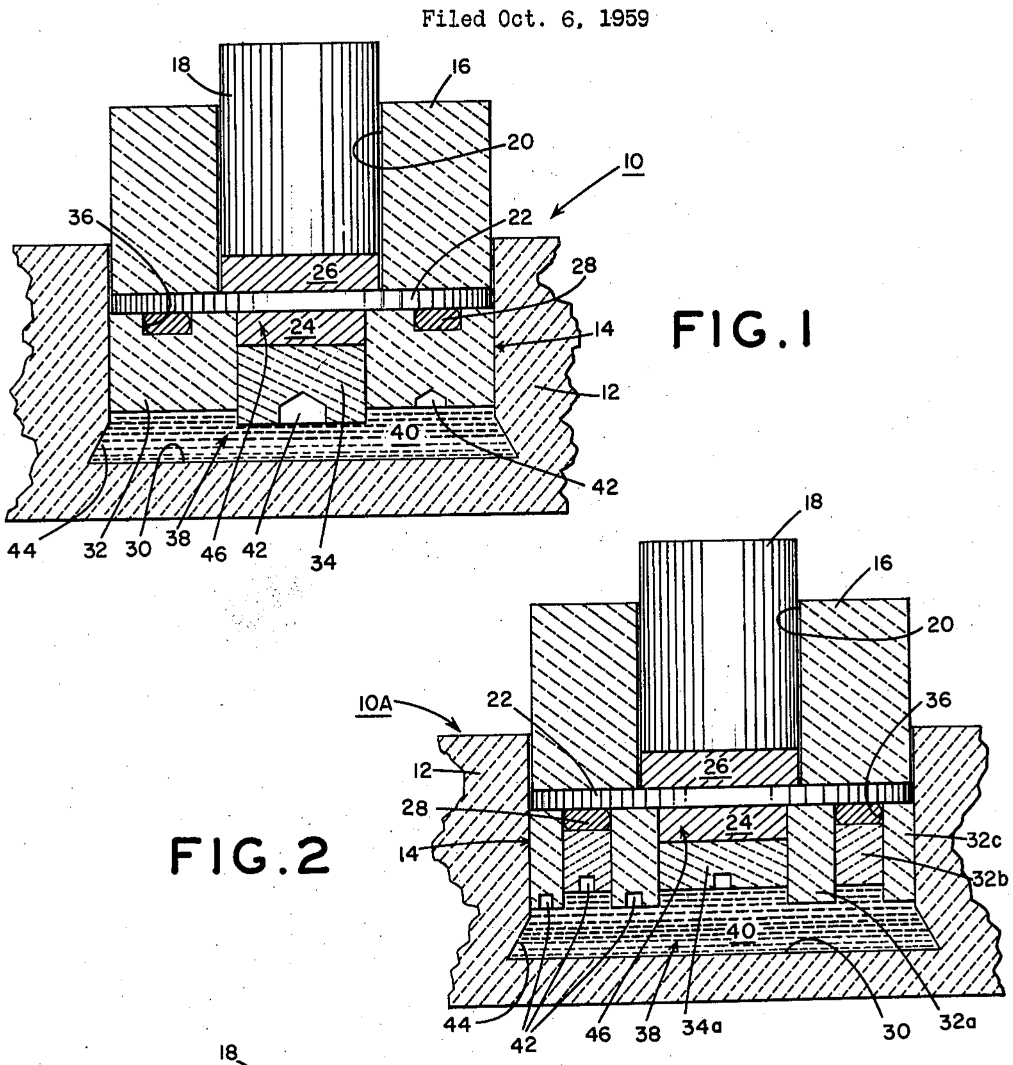

This invention relates to alloying fixtures for semiconductor devices, particularly devices, such as transistors, which have alloyed P-N junctions and/or ohmic base contacts formed on opposite sides of a semiconductor wafer.

As used herein, "contacts" is intended to embrace rectifying junctions as well as ohmic contacts. One of the most widely used commercial methods of fabricating semiconductor devices at the present time involves the alloying of suitable metal pellets or "preforms" to a wafer or die of semiconductor material of desired conductivity type. Alloying is customarily accomplished by disposing the wafer of semiconductor material and the alloy metal pellets in proper relative positions in an alloying boat, suitably weighting down the assembly to insure intimate physical contact between the pellets and the respective surfaces of the wafer, and placing the loaded boat in an alloying furnace. Conveniently, the non-rectifying electrode or base contact may be applied at the same time.

In the formation of P-N junctions by alloying it is important that the alloying metal wet the surface of the semiconductor wafer; poor wetting during alloying gives semiconductor devices with poor electrical properties. In the alloying methods generally practiced heretofore, it is usually noticeable that better wetting occurs on the upper surface of the wafer than on the lower, the designation "upper" and "lower" having reference to the wafer position while in the alloying furnace. The difference in wetting is generally attributed to the dissimilarity in contact pressure existing between the upper and lower alloying pellets and the respective surfaces of the wafer. This difference in pressure stems from the fact that the alloy preforms disposed under the wafer are placed in locating recesses in the bottom surface of the boat; due to necessary commercial tolerances on the volume of the alloy preforms and the volume of the recesses, there is lack of uniformity in the resultant pressures.

Attempts have been made to solve this problem in the past with varying degrees of success. One solution which has been resorted to is known as "double alloying," i.e., performing the alloying in two steps, inverting the wafer between furnace passes, so that the wafer surface being alloyed is uppermost each time. Another proposed solution is the use of elaborate spring and plunger arrangements for maintaining uniform pressures with respect to both the top and bottom surfaces of the wafer. Both of these approaches to the problem produce satisfactory results but both are unduly expensive in terms of increased labor and/or complexity of apparatus. One satisfactory solution to the problem is disclosed and claimed in copending application for U.S. Letters Patent Serial No. 844,765 filed October 6, 1959; the present invention is concerned with an alternative solution.

It is, therefore, the fundamental object of the present invention to provide novel alloying fixtures for semiconductor devices which overcome at least one of the problems of the prior art as outlined above.

A more specific object is the provision of improved alloying fixtures which enable the simultaneous alloying of rectifying junctions (and/or the formation of ohmic contacts) on both surfaces of a semiconductor wafer with uniform or controlled alloying pressures.

Another object is the provision of alloying fixtures as characterized in the next preceding object which are relatively simple and inexpensive in construction and foolproof in operation.

These and other objects are accomplished by alloying fixtures in accordance with the present invention which comprise an alloying boat containing a parallel-walled cavity and adapted to receive, in a plane perpendicular to the cavity wall, a semiconductor wafer. A plurality of piston elements is disposed in the cavity for mutually independent sliding movement parallel to the cavity wall and co-acting to define, between the bottom of the cavity and the undersides of the pistons, a fluid-tight chamber for fluid material effective as a hydraulic medium to support and apply pressure to each of the pistons above the bottom of the cavity. The pistons serve to apply pressure to the alloy regions on the underside of the wafer during alloying.

Figure 3:
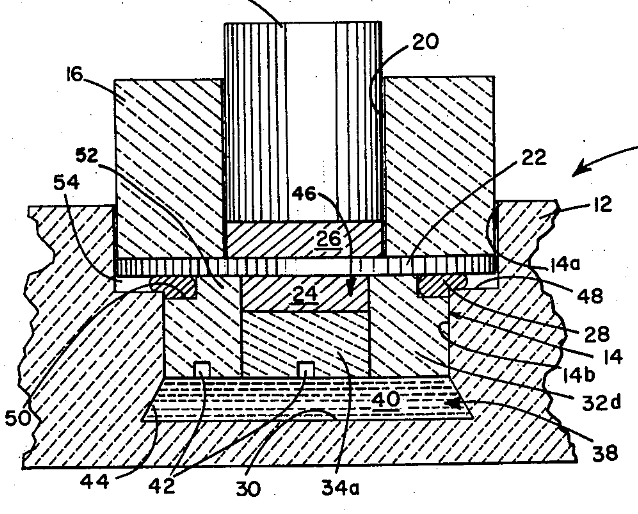

Further objects of the invention, its advantages, scope, and the manner in which it may be practiced will be readily apparent to those conversant with the art from the following description and subjoined claims taken in conjunction with the annexed drawing, wherein like reference numerals designate like parts throughout the several views and wherein:

FIGURE 1 is a vertical sectional view, on an enlarged scale and partly in elevation, of an alloying fixture in accordance with and embodying the present invention; and FIGURES 2 and 3 are views similar to FIGURE 1 each illustrating another exemplary embodiment of the invention.

Referring now to FIGURE 1 there is illustrated an alloying fixture 10 three basic components of which, in their general aspects, are more or less conventional in design, namely an alloying boat 12 containing a cavity 14, tubular "plug" 16 slidably receivable within the cavity, and a "pin" 18 slidably receivable within the tubular plug.

While individual alloying boats may be used for each device to be alloyed, in volume production it is customary to employ relatively large boats capable of holding a number of alloying assemblies. The boat may be made of any suitable material which is not wet by nor reactive with the elements disposed therein. For germanium devices, graphite boats are probably the most commonly used.

For each semiconductor device to be alloyed boat 12 contains relatively shallow, parallel-walled cavity 14, the cross-sectional shape and dimensions of which conform to those of the semiconductor wafer to be alloyed, the cavity being thus adapted to receive such a wafer freely slidably disposed therein in a plane perpendicular to the sidewalls. Inasmuch as semiconductor wafers for transistors are conveniently of discoid configuration, this particular shape will be assumed for the purposes of example throughout the present description. In accordance with this assumption, cavity 14 would be of cylindrical shape and, accordingly, plug 16 would have a cylindrical outer surface dimensioned for a free sliding fit in the cavity.

The inner peripheral surface 20 of plug 16 conforms in cross-sectional shape and dimension to the junction or contact to be formed on the upper surface of the wafer as will hereinafter appear. Inasmuch as such junctions or contacts frequently are of circular configuration, and concentrically disposed on the wafer, these specific conditions will also be assumed for the purposes of example in the ensuing description. From this assumption it follows that inner surface 20 of plug 16 is cylindrical and pin 18, which is freely slidably receivable therein, takes the form of a solid cylinder.

Before continuing with the description, it is pointed out that the alloying fixture in FIGURE 1, as well as in the remaining views, is illustrated in fully assembled and loaded condition for alloying a transistor of currently popular design. Consequently, it includes: a discoid wafer 22 of semiconductor material; the alloy material 24 which forms the emitter junction on the central undersurface of the wafer; the alloy material 26 which forms the collector junction on the central upper surface of the disk opposite to the emitter junction; and an annular preform 28 of any suitable material, such as tin-antimony solder, which makes ohmic contact with the semiconductor wafer in order to form the customary base ring connection.

It will be appreciated that the components of the alloying fixture thus far described, namely boat 12, plug 16, and pin 18, are generally conventional. It will also be understood that, in a conventional alloying boat of this type, indentations ordinarily would be provided in the bottom surface 30 of cavity 14 to contain preforms of the alloying metal, the size, shape and location of the indentations being selected to control the size and placement of the alloy contacts. In using such a conventional fixture, preforms such as 24 and 28 would be loaded into the indentations in the bottom of the recess, a semiconductor wafer inserted into the recess so that it rested upon the bottom surface, tubular plug 16 inserted into the cavity, with its lower end resting upon an annular peripheral portion of the upper surface of the wafer. Another alloy metal pellet or preform would then be inserted into the interior of the tubular plug and finally pin 18 coaxially inserted into the plug, its lower end resting upon and keeping the preform in intimate surface contact with the wafer. This assembly would then be brought to alloying temperatures in a suitable furnace.

In accordance with the present invention alloying fixture 10 is provided with a plurality of plungers or pistons which are disposed within cavity 14 for mutually independent sliding movement parallel to the cavity sidewall and defining a substantially fluid-tight chamber at the bottom of the cavity as will now be described with greater particularity and continued reference to FIGURE 1.

In the exemplary embodiment illustrated in FIGURE 1 two pistons, 32 and 34, are provided. In keeping with the assumed conditions of a circular wafer and circular, concentric alloy contacts, piston 32 is annular in configuration and has an outer diameter adapting it to be freely slidably received in cavity 14 while forming a substantially fluid-tight seal with the sidewall thereof; its upper surface is provided with a groove 36 for the containment of base ring preform 28. The inner diameter of annular piston 32 conforms to the diameter of the emitter junction to be alloyed on wafer 22. Piston 34 is cylindrical in form and dimensioned to be coaxially received within the interior of annular piston 32 with a free-sliding, substantially fluid-tight fit. As will more fully appear as this description proceeds, the "fluid-tight" fits referred to herein may be obtained with economical commercial mechanical tolerances as long as the fluid sealed against does not wet the material of the boat and piston, is not under excessive pressure, and has a modest amount of surface tension. Operable limits are readily calculated considering the radius of curvature of the fluid in the clearance gap.

Pistons 32 and 34, coaxially nested as illustrated, are disposed within cavity 14, prior to loading of the transistor components, and co-act with bottom 30 of the cavity to define a substantially fluid-tight chamber 38.

Prior to insertion of pistons 32 and 34 the bottom of cavity 14 is filled with a material 40, hereinafter described, which is a fluid at least at some stage of the temperature range reached during the alloying procedure. Preferably, the undersides of pistons 32 and 34 are provided with one or more small indentations such as indicated by reference numerals 42 and the bottom of the sidewall of cavity 14 notched or flared outwardly about part or the entire circumference as indicated at 44 for a purpose which will presently appear.

As will be seen from the description of the use and operation of the alloying fixture which follows, material 40 in chamber 38, when in fluid condition, serves as a hydraulic medium acting with equal pressure on the undersides of pistons 32 and 34. Assuming that material 40 is one which is normally a solid, for example, a fusible salt or metal alloy, once alloying fixture 10 (i.e., boat 12 with pistons 32 and 34 in place and chamber 38 filled) has been subjected to a temperature high enough to fuse the particular material 40 and then cooled below its melting point, the material resolidifies and locks the pistons in the particular relative position occupied at the time of solidification. This effect of locking the pistons in position is assisted by the presence of indentations 42 and notches 44 into which material 40 flows while in the molten state thus preventing disassembly of the pistons when the wafer is removed. With the pistons locked in the relative positions as illustrated in FIGURE 1, that is, with inner piston 34 depressed with respect to the outer piston 32, there is defined a small cylindrical cavity 46 adapted for the reception of preform 24 for alloying the emitter junction. In this condition, fixture 10 is ready for loading, which involves placing emitter preform 24 into cavity 46 and base ring preform 28 into annular groove 36 in the upper side of piston 32. Semiconductor wafer 22 then is placed atop the piston 32 and plug 16, collector preform 26 and pin 18 installed in the order stated and in the conventional manner.

The loaded fixture is then subjected to an appropriate alloying temperature. When material 40 in chamber 38 has fused, it functions to divide the force resulting from the weight of the assembly above wafer 22 between pistons 32 and 34 to exert controllable pressure of alloy 24 against the wafer, and also of piston 32 against the wafer. The distribution of forces and pressures in the system can be determined by well-known laws of buoyancy, static hydraulics and static mechanics. Variations in weight of members 16 and 18, the density and weight of pistons 32 and 34, the density of molten material 40, the relative depth of immersion of pistons 32 and 34 in molten liquid 40, and the cross-sectional areas of pistons 32 and 34 are all variable parameters which can be adjusted to control the absolute and relative forces or pressures of various components on the wafer. Surface tension effects at the corners of the pistons can also be employed to adjust the forces, for example, to increase the force on the piston 34 and decrease the force on piston 32.

Material 40 should be selected to minimize or to avoid entirely contamination problems and to have a melting point such that pressure of alloy 24 against the wafer 22 is applied before, at, or after melting of material 40. The optimum time of fusion of material 40 depends on such factors as the specific etching procedure employed for alloy 24, the alloying furnace atmosphere, and whether resetting (i.e., pushing piston 34 down so that alloy pellet 24 does not touch wafer 22 prior to the time that the material in chamber 38 fuses and applies pressure) is economically feasible.

If otherwise satisfactory or preferable, material 40 can be one that is a liquid at room temperature with or without facilities provided for freezing it during loading and unloading of the fixture in order to maintain the pistons locked in the desired relative positions.

In alloying fixture 10, pressure is applied only to alloy 24, base ring alloy 28 being contained in groove 36 on piston 32, thus isolating it from the force exerted by piston 32 against the underside of wafer 22. The general principal of the invention can, of course, be adapted to apply pressure to both or any number of alloy metal preforms which are to be alloyed to the underside of the wafer. Such a modification of the invention designated 10A, is illustrated in FIGURE 2 wherein it will be noted that the basic, generally conventional components of the fixture, namely boat 12, plug 16 and pin 18 are essentially identical to and are identified by the same reference numerals as their counterparts in FIGURE 1. The difference of the FIGURE 2 embodiment resides in the particular structure of the piston arrangement. In alloy fixture 10A four concentric piston elements are used: a circular central piston 34a coaxially nested within annular pistons 32a, 32b, and 32c of progressively greater diameter. Thus, circular piston 34a is freely slidable within annular piston 32a and co-acts therewith to define cavity 46 for the reception of the emitter alloy preform 24. Piston 32c, the outermost piston, slidably and sealingly engages the sidewall of cavity 14.

The inner diameter of piston 32c and outer diameter of piston 32a are selected to leave between them an annular space corresponding in dimension and location to the base ring contact to be formed on wafer 22. This annular space is occupied by piston 32b, the inner circumferential surface of which slidable and sealingly contacts the outer circumferential surface of piston 32a. The outer circumferential surface of piston 32b slidably and sealingly contacts the inner circumferential surface of piston 32c. Thus it will be seen that each of the various pistons is independently coaxially movable relative to the others and to cavity 14 in a direction parallel to the cavity sidewalls. As shown, the dimensions of the various pistons in the direction of movement may be selected to provide the proper size of recess 46 and annular groove 36 for the containment of alloy preforms 24 and 28, respectively, with a minimum of piston travel and, concomitantly, a minimum requirement for the vertical dimension of the space (chamber 38) below wafer 22 to accomodate such travel. If desired, annular pistons 32a and 32c can be replaced by stationary guide rings of the same lateral dimension, configuration, and location. If such guide rings were extended downwardly to bottom 30 of cavity 14 as a matter of structural necessity, it would, of course, be necessary to provide radial openings in the guide ring corresponding to piston 32a in order to maintain a path of communication between the volumes of chamber 38 underlying pistons 34a and 32b for the flow of material 40. The operation and use of alloy fixture 10A is essentially the same as that already described in conjunction with the FIGURE 1 embodiment.

The principal of the present invention can also be embodied in and used in conjunction with alloying fixtures of the type described and claimed in the aforementioned copending application Serial No. 844,765. Such an embodiment of the invention is illustrated by alloying fixture 10B shown in FIGURE 3. Here again the basic components of the fixture are conventional: alloying boat 12, a tubular plug 16 and cylindrical pin 18. The boat cavity 14, however, is in the form of a stepped bore having its larger diameter section 14a at its open (upper) end, thus, creating an upwardly facing radial shoulder 48 on the cavity sidewall. Freely slidable in the lower, smaller diameter section 14b of the cavity is an annular piston 32d containing an annular channel 50 in its upper surface adjacent its outer circumference. Channel 50 is located and dimensioned to receive base ring preform 28 as shown in FIGURE 3; the portion of the upper surface of piston 32d radially inward of the annular channel 50 remains as a raised annular rib or boss 52. Freely slidable within annular piston 32d is circular piston 34a, the upper surface of which, in cooperation with the inner circuferential surface of piston 32d, defines recess 46 for the reception of emitter alloy pellet 24. Except for the presence of shoulder 48 on the wall of cavity 14 and channel 50 on top of annular piston 32d, fixture 10B is structurally very similar to that shown in FIGURE 1.

The depth of material 40 confined in chamber 38 is selected, in relation to the height of the shoulder 48, the thickness of piston 32d and the depth of the base ring preform channel 50, so that when semiconductor wafer 22 is loaded into the fixture and rests upon annular rib 52 on top of the piston there is a small annular clearance between the shoulder and the underside of the wafer as indicated at 54.

Base ring preform 28 is selected to provide a volume of molten material at alloying temperatures which exceeds the volume of channel 50 so that excess material is squeezed out into annular space 54 between shoulder 48 and the underside of the wafer 22. As explained in the aforementioned copending application Serial No. 844,765 the material in base ring channel 50 is under a pressure due and proportional to the surface tension existing at the meniscus surface of the molten alloy squeezing out into annular clearance space 54. Control of the thickness of this clearance determines the radius of the liquid surface under tension and thereby permits regulation of the pressure in the molten alloy. In this connection, it is pointed out that the dimension of the clearance space would vary with position of piston 32d which, in turn, is related to the position of piston 34a. The interrelation of these factors is taken into account in the design of a specific fixture. The use and operation of the alloying fixture is the same in principal as and readily apparent from the previous description relative to the first described embodiment.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by U.S. Letters Patent is:

1. A fixture for alloying contacts on a semiconductor wafer in the fabrication of junction-type semiconductor devices, comprising: an alloying boat including bounding surface means defining in said boat a cavity having a closed bottom and parallel sidewalls and adapted to receive, in a plane perpendicular to the sidewalls, a semiconductor wafer; a plurality of piston elements disposed in said cavity for mutually independent rectilinear displacement parallel to the sidewalls of the cavity and coacting to define, between the bottom of the cavity and the undersides of the piston elements, a fluid-tight chamber for a material, fluid at the service temperature of the fixture and effective as a hydraulic medium to support and position said piston elements above the bottom of the cavity, said piston elements comprising a piston slidably and sealingly engaging the sidewall of said cavity and containing a central aperture extending therethrough bounded by surfaces parallel to the sidewalls of the cavity, the transverse dimension and configuration of said aperture conforming substantially to one of the alloyed regions to be formed on the semiconductor wafer; and a second piston slidably and sealingly disposed in said aperture for linear displacement therein parallel to said bounding surfaces thereof.

2. A fixture for alloying contacts on a semiconductor wafer in the fabrication of junction-type semiconductor devices, comprising: an alloying boat including bounding surface means defining in said boat a cavity having a closed bottom and parallel sidewalls and adapted to receive, in a plane perpendicular to the sidewalls, a semiconductor wafer; a plurality of piston elements disposed in said cavity for mutually independent rectilinear displacement parallel to the sidewalls of the cavity and coacting to define, between the bottom of the cavity and the undersides of the piston elements, a fluid-tight chamber for a material, fluid at the service temperature of the fixture and effective as a hydraulic medium to support and position said piston elements above the bottom of the cavity, said cavity being cylindrical in configuration and said piston elements comprising an annular piston having an inner circumference conforming dimensionally to an alloyed region to be formed on the semiconductor wafer, said piston being sealingly and slidably disposed coaxially in said cavity for rectilinear displacement parallel to the sidewalls thereof; and a circular piston coaxially nested within said annular piston in sealing and sliding engagement with the inner circumferential surfaces thereof for rectilinear axial displacement with respect to said annular piston.

3. An alloying fixture in accordance with claim 2, including a second and third annular piston nested concentrically about said first annular piston with mutual sliding and sealing relation between the respective contiguous inner and outer circumferential surfaces of the pistons, the outer circumferential surface of the outermost piston sealingly and slidably engaging the sidewall of said cavity, the dimensional difference between the outer diameter of said first annular piston and the inner diameter of said outermost annular piston being selected to conform to the desired placement and radial dimensions of an annular contact to be formed on said semiconductor wafer.

4. An alloying fixture in accordance with claim 2, wherein the upper surface of said annular piston contains an annular groove conforming in radial dimension and location to an annular electrode to be formed on said semiconductor wafer.

5. A fixture for alloying contacts onto semiconductor wafers, comprising: an alloying boat including bounding surface means defining in said boat a cylindrical cavity having a closed bottom and adapted to receive coaxially a circular semiconductor wafer for alloying; an annular piston adapted to be coaxially disposed in said cylindrical cavity with its outer circumferential surface in slidable sealing contact with the sidewall thereof, the inner diameter of said annular piston being dimensionally adapted to contain an alloy metal preform for alloying to a semiconductor wafer and to define the region to be alloyed by the preform; and a circular piston adapted to be coaxially nested within said annular piston with its circumferential surface in slidable sealing contact with the inner circumferential surface of the annular piston, said pistons co-acting, when disposed in said cavity, to define a closed chamber at the bottom thereof.

6. A fixture for alloying contacts onto semiconductor wafers, comprising: an alloying boat including bounding surface means defining in said boat a cylindrical cavity having a closed bottom and adapted to receive coaxially a circular semiconductor wafer for alloying; an annular piston coaxially disposed in said cylindrical cavity with its outer circumferential surface in slidable sealing contact with the sidewall thereof, the inner diameter of said annular piston being dimensionally adapted to contain an alloy metal preform for alloying to a semiconductor wafer and to define the region to be alloyed by the preform; a circular piston coaxially nested within said annular piston with its circumferential surface in slidable sealing contact with the inner circumferential surface of the annular piston, said pistons co-acting, when disposed in said cavity, to define a closed chamber at the bottom thereof; and, filling said chamber, a material which is fluid at least at a temperature reached during alloying.

7. A fixture according to claim 6 wherein said material is a solid at room temperature.

8. A fixture according to claim 7 including means defining recesses in the surfaces bounding said chamber adapted to receive said material when fluid and upon solidification thereof, to interlock said pistons in said cavity.

9. A fixture for alloying contacts on semiconductor wafers, comprising: an alloying boat including bounding surface means defining in said boat a cylindrical cavity having a closed bottom and adapted to receive coaxially a circular semiconductor wafer for alloying; and means, including a circular and an annular piston concentrically disposed in said cavity for linear axial displacement independently of each other, defining a closed chamber at the bottom of said cavity, the radial dimensions of said pistons governing the placement and dimension of contacts to be formed on the semiconductor wafer.

10. A fixture in accordance with claim 9, wherein said means further include a second annular piston coaxially disposed between said circular and first annular piston and having inner and outer circumferential surfaces in sliding and sealing contact with the outer and inner circumferential surfaces respectively of said circular and first annular piston; and a third annular piston coaxially disposed about said first and second annular piston and having its inner and outer circumferential surfaces in sliding and sealing contact with the outer circumferential surface of said first annular piston and the sidewall of said cavity, respectively.

11. A fixture for alloying contacts onto semiconductor wafers, comprising: an alloying boat including bounding surface means defining in said boat a cylindrical cavity having a closed bottom and adapted to receive coaxially a semiconductor wafer; an annular piston coaxially disposed in said cavity with its outer circumferential surface in slidable sealing contact with the sidewall thereof; a circular piston coaxially nested within said annular piston with its circumferential surface in slidable sealing contact with the inner circumferential surface of the annular piston, said pistons co-acting to define a closed chamber at the bottom of said cavity, and, further co-acting to define, above the pistons, an upwardly open locating recess for the reception of an alloying preform, said recess being closed, in the presence of a semiconductor wafer in said cavity, by the undersurface of such wafer; and means defining a passage of relatively small lateral dimension opening into said recess.

12. A fixture according to claim 11, wherein said cavity takes the form of a stepped bore having its larger diameter adjacent to the upper, open end of the cavity, so as to define an upwardly facing annular shoulder on the cavity sidewall, said annular piston having an annular channel in its upper surface adjacent its outer circumference adapted to contain an alloy preform and, with said pistons in the positions normally occupied during alloying, co-acting with said shoulder to define said passage.

References Cited in the file of this patent

UNITED STATES PATENTS

| | | |
|---|---|---|
| 30,647 | Sharps | Nov. 13, 1860 |
| 2,267,954 | Schumacher | Dec. 30, 1941 |
| 2,842,723 | Koch et al. | July 8, 1958 |